United States Patent
Klass (10) Patent No.: US 6,353,339 B1
(45) Date of Patent: Mar. 5, 2002

(54) MODIFIED DOMINO LOGIC CIRCUIT WITH HIGH INPUT NOISE REJECTION

(75) Inventor: Edgardo F. Klass, Palo Alto, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/591,544

(22) Filed: Jun. 8, 2000

(51) Int. Cl.⁷ .................................................. H03K 19/096
(52) U.S. Cl. ............................ 326/98; 326/95; 326/93
(58) Field of Search ............................ 326/93, 95, 98; 327/208, 210, 211

(56) References Cited

U.S. PATENT DOCUMENTS

| | | | |
|---|---|---|---|
| 5,818,264 A | * 10/1998 | Ciraula et al. | ................. 326/98 |
| 5,838,169 A | * 11/1998 | Schorn | ........................ 326/98 |
| 5,933,038 A | 8/1999 | Klass | ........................ 327/208 |
| 6,111,434 A | * 8/2000 | Ciraula et al. | ................. 326/98 |

* cited by examiner

Primary Examiner—Michael Tokar
Assistant Examiner—Vibol Tan
(74) Attorney, Agent, or Firm—Gunnison, McKay & Hodgson, L.L.P.; Philip J. McKay (57) ABSTRACT

A transistor is added to prior art domino logic circuits to create a modified domino logic circuit with a resistor divider connected between a first internal node and a second internal node. The resistor divider keeps the second internal node at a voltage that is higher than a second supply voltage VSS at the beginning of the evaluation phase of modified domino logic circuit. Consequently, the first internal node of the modified domino logic circuit will not start discharging until a higher voltage is reached by input signals. Thus, the input noise rejection of the modified domino logic circuits of the present invention is improved compared with prior art domino logic circuits.

20 Claims, 4 Drawing Sheets

MODIFIED DOMINO LOGIC CIRCUIT WITH HIGH INPUT NOISE REJECTION

FIELD OF THE INVENTION

The present invention relates to digital circuits and, more particularly, to domino logic circuits. Still more particularly, the present invention relates to modified domino logic circuits with increased noise tolerances.

BACKGROUND OF THE INVENTION

Figure 1A:
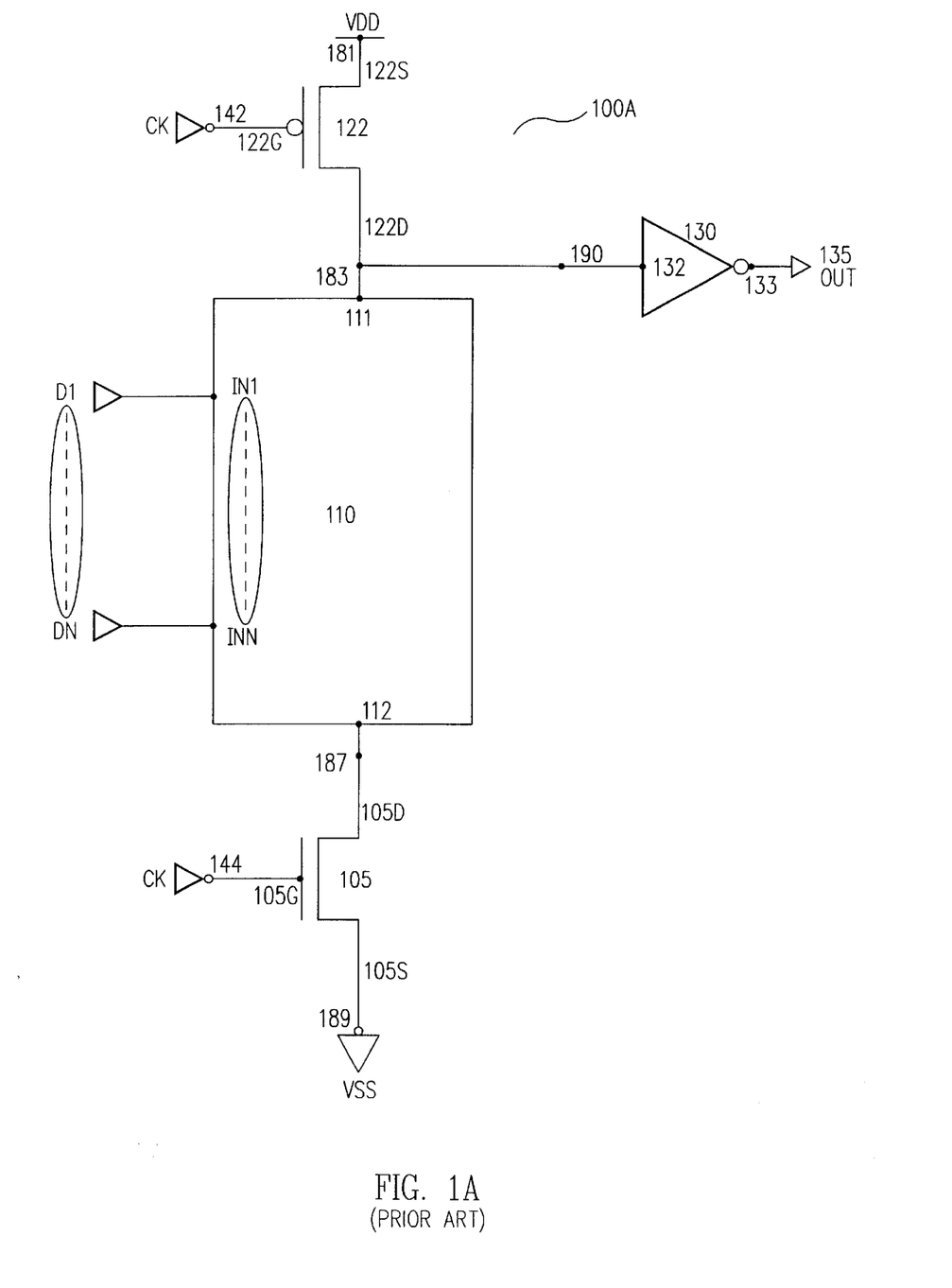

Domino logic circuits are well known to those of skill in the art. FIG. 1A schematically illustrates a generalized prior art domino logic circuit 100A which typically included: supply voltage VDD; P-channel transistor 122; logic block 110, with data input nodes IN1 to INN; inverter 130; N-channel transistor 105; and ground supply voltage VSS.

In generalized prior art domino logic circuit 100A, source 122S of P-channel transistor 122 was coupled to junction 181 and supply voltage VDD. Gate 122G of P-channel transistor 122 was connected to node 142 which received clock signal CK. Drain 122D of P-channel transistor 122 was connected to junction 183. Node 183 was connected to a first internal node 190 and node 111 of logic block 110. First internal node 190 was also connected to input node 132 of inverter 130. Inverter 130 included output node 133 that was coupled to circuit output node 135.

Logic block 110 typically comprised one of several different logic circuits and/or gates well known to those of skill in the art. For instance, in one embodiment, logic block 110 comprised AND gate logic. However, logic block 110 could also comprise a NAND gate, OR gate, NOR gate, selective OR gate or any other gate or logic circuit required for a particular application of generalized prior art domino logic circuit 100A. Input nodes IN1 to INN of logic block 110 were connected to receive data signals D1 to DN. The number of data signals "DN", and therefore the number in input nodes "INN" varied depending on the logic making up a particular embodiment of logic block 110 and the requirements of the system (not shown) employing prior art domino logic circuit 100A. A specific embodiment of logic block 110 is discussed in more detail below.

Logic block 110 also included node 112 that was connected to a second internal node 187. Second internal node 187 was connected to drain 105D of N-channel transistor 105. Gate 105G of N-channel transistor 105 was connected to input node 144 to receive the clock signal CK. Source 105S of N-channel transistor 105 was then connected to junction 189 and ground supply voltage VSS.

Figure 1B:
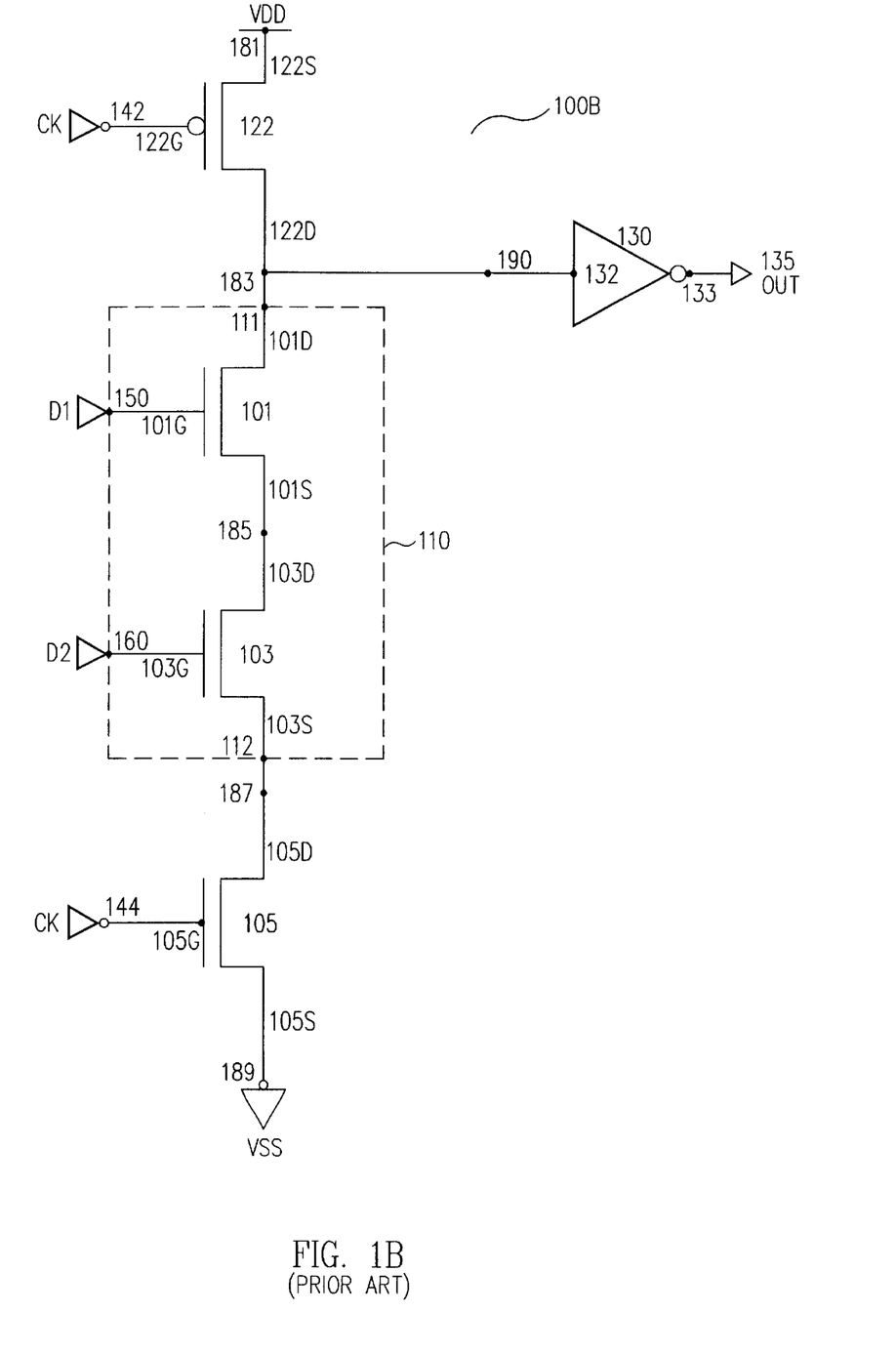
FIG. 1B schematically illustrates one embodiment of the generalized prior art domino logic circuit of FIG. 1A.

FIG. 1B schematically illustrates a prior art domino logic circuit 100B. Prior art domino logic circuit 100B is one of several possible embodiments of generalized prior art domino logic circuit 100A discussed above. Consequently, prior art domino logic circuit 100B is identical to generalized prior art logic circuit 100A but includes an AND gate embodiment of logic block 110 which comprises two data inputs, D1 and D2, and two N-channel transistors 101 and 103.

Prior art domino logic circuit 100B typically received two input data signals D1 and D2 at nodes 150 and 160, respectively. Prior art domino logic circuit 100B, like generalized prior art domino logic circuit 100A, also typically included P-channel transistor 122 and N-channel transistor 105.

As shown in FIG. 1B, N-channel transistors 101 and 103 were typically NMOS transistors having their channel regions connected in series between the drain 122D of P-channel transistor 122 at junction 183 and the drain 105D of N-channel transistor 105 at second internal node 187. More specifically, the source 122S of P-channel transistor 122 was connected to supply voltage VDD at junction 181 and the drain 122D of P-channel transistor 122 was connected to junction 183, first internal node 190, and input node 132 of inverter 130. Inverter 130 also included output node 133 connected to circuit output node 135.

N-channel transistor 101 typically had its drain 101D connected to junction 183 that, as discussed above, was connected to drain 122D of P-channel transistor 122, first internal node 190, and input node 132 of inverter 130. Source 101S of N-channel transistor 101 was connected to the drain 103D of N-channel transistor 103 at junction 185. The source 103S of N-channel transistor 103 was connected to drain 105D of N-channel transistor 105 at second internal node 187. The source 105S of N-channel transistor 105 was connected to ground supply voltage VSS at junction 189.

As with generalized prior art domino logic circuit 100A discussed above, in prior art domino logic circuit 100B, gate 122G of P-channel transistor 122 and gate 105G of N-channel transistor 105 were connected to nodes 142 and 144, respectively, to receive the clock signal CK. In addition, gate 101G of N-channel transistor 101 was connected to node 150 to receive data signal D1 and gate 103G of N-channel transistor 103 was connected to node 160 to receive data signal D2.

Particular types of transistors are discussed above, made by particular processes and with particular first or second channel types, i.e., "P" or "N" channel types. However, those of skill in the art will readily recognize that other types of transistors, made by other processes and/or having opposite first and second channel types, could be employed by making minor modifications such as changing the supply voltages VSS and VDD. The choice of the particular transistor types for the discussion above was made for exemplary purposes only. Therefore, this choice of transistor types should not be read as limiting the discussion of the prior art, or the invention, to the particular embodiments shown.

Disadvantageously, prior art domino logic circuits 101A and 100B were very sensitive, and therefore susceptible to, input noise levels on signals D1 to DN. Consequently, an input noise peak larger in magnitude than the threshold voltage of the evaluation device could, and often would, trigger domino logic circuit 100A or 100B and cause a logic malfunction. This was primarily because prior art domino logic circuits 100A and 100B did not use complementary logic so there was no buffer or "fight" with a complementary component during evaluation. Consequently, first internal node 190 of prior art domino logic circuits 100A and 100B started discharging as soon as the level of input signal D1 to DN went slightly above the threshold voltage of the pull down (or pull up) device, i.e., N-channel transistors 101 and 103 in FIG. 1B.

For instance, referring to FIG. 1B, assume data signal D1 at node 150 was high, i.e., a logic "1", during evaluation, i.e., when clock signal CK was a high. In this case, first internal node 190 would start discharging when data signal D2 at node 160 reached the threshold voltage of N-channel transistor 103 (VTH103). Assuming that clock signal CK was high prior to signal D2 reaching VTH103, second internal node 187, i.e., source 103S of N-channel transistor 103 was at the same voltage as the ground supply voltage VSS. Therefore, the threshold voltage of N-channel transistor 103 was the threshold specified at zero bias voltage, i.e., VTH103, assuming no body effect. Consequently, prior art domino logic circuits 100A and 100B were very sensitive and susceptible to input noise levels and suffered from poor noise rejection characteristics and a low noise threshold.

Since prior art domino logic circuits 100A and 100B were so sensitive and susceptible to input noise levels, in prior art systems where input noise levels could not be reduced by other means static buffers were added to the inputs of dynamic domino logic circuits, such as prior art domino logic circuits 101A and 100B. The addition of these static buffers (not shown) created a static domino logic circuit (not shown) that was less vulnerable to noise. However, using this prior art buffer method, at least four additional devices (not shown) were required for each static buffer. Consequently, this method had a large penalty in terms of silicon area required to implement it and in speed. The speed penalty arose because each buffer added at least two (2) inverter delays.

What is needed is a method and structure to make a domino logic circuit that is less sensitive to input noise yet does not suffer large power and/or speed penalties.

SUMMARY OF THE INVENTION

According to the method and structure of the invention, a transistor is added to prior art domino logic circuits to create a modified domino logic circuit with a resistor divider connected between a first internal node and a second internal node. The resistor divider keeps the second internal node at a voltage that is greater than a second supply voltage at the beginning of the evaluation phase of the modified domino logic circuit. Consequently, a first internal node of the modified domino logic circuit will not start discharging until a greater voltage is reached by input signals. Thus, the input noise rejection of the modified domino logic circuit of the present invention is improved compared with prior art domino logic circuits.

In one embodiment of the invention, the modified domino logic circuit includes a first internal node and a second internal node. The first internal node is coupled to an output node of the modified domino logic circuit. A first transistor of a first channel type includes a first flow electrode, a second flow electrode and a control electrode. The first flow electrode of the first transistor is coupled to the second internal node of the modified domino logic circuit, the second flow electrode of the first transistor is coupled to a first supply voltage and the control electrode of the first transistor is coupled to the first internal node of the modified domino logic circuit. A second transistor of the first channel type includes a first flow electrode, a second flow electrode and a control electrode. The second flow electrode of the second transistor is coupled to the second internal node of the modified domino logic circuit, the first flow electrode of the second transistor is coupled a second supply voltage. As a result, the first and second transistors of the first channel type form a resistor divider coupled between the first internal node and the second internal node of the modified domino logic circuit.

In another embodiment of the invention, a first transistor of a second channel type includes a first flow electrode, a second flow electrode and a control electrode. The first flow electrode of the first transistor is coupled to a first supply voltage, the control electrode of the first transistor is coupled to receive a clock signal and the second flow electrode of the first transistor is coupled to a first internal node of the modified domino logic circuit. A logic block includes a first node, a second node, and at least one input node. The first node of the logic block is coupled to the first internal node of the modified domino logic circuit, the at least one input node of the logic block is coupled to receive at least one data signal and the second node of the logic block is coupled to a second internal node of the modified domino logic circuit. A second transistor of a first channel type includes a first flow electrode, a second flow electrode and a control electrode. The second flow electrode of the second transistor is coupled to the second internal node of the modified domino logic circuit, the control electrode of the second transistor is coupled to receive the clock signal and the first flow electrode of the second transistor is coupled to a second supply voltage. A third transistor of the first channel type includes a first flow electrode, a second flow electrode and a control electrode. The first flow electrode of the third transistor is coupled to the second internal node of the modified domino logic circuit, the second flow electrode of the third transistor is coupled to the first supply voltage and the control electrode of the third transistor is coupled to the first internal node of the modified domino logic circuit.

In yet another embodiment of the invention, a first transistor of a second channel type includes a first flow electrode, a second flow electrode and a control electrode. The first flow electrode of the first transistor is coupled to a first supply voltage, the control electrode of the first transistor is coupled to receive a clock signal and the second flow electrode of the first transistor is coupled to a first internal node of the modified domino logic circuit. A second transistor of a first channel type includes a first flow electrode, a second flow electrode and a control electrode. The second flow electrode of the second transistor is coupled to the second flow electrode of the first transistor and the control electrode of the second transistor is coupled to receive a first data signal. A third transistor of the first channel type includes a first flow electrode, a second flow electrode and a control electrode. The second flow electrode of the third transistor is coupled to the first flow electrode of the second transistor, the control electrode of the third transistor is coupled to receive a second data signal and the first flow electrode of the third transistor is coupled to a second internal node of the modified domino logic circuit. A fourth transistor of the first channel type includes a first flow electrode, a second flow electrode and a control electrode. The second flow electrode of the fourth transistor is coupled to the second internal node of the modified domino logic circuit, the control electrode of the fourth transistor is coupled to receive the clock signal and the first flow electrode of the fourth transistor is coupled to a second supply voltage. A fifth transistor of the first channel type includes a first flow electrode, a second flow electrode and a control electrode. The first flow electrode of the fifth transistor is coupled to the second internal node of the modified domino logic circuit, the second flow electrode of the fifth transistor is coupled to the first supply voltage and the control electrode of the fifth transistor is coupled to the first internal node of the modified domino logic circuit.

As described above, and in more detail below, in accordance with the present invention, an additional transistor of a first channel type is added to traditional prior art domino logic circuits, such as prior art domino logic circuits 100A and 100B discussed above. In one embodiment of the invention, a control electrode, e.g., the gate, of the added transistor is connected to a first internal node. The first internal node is connected to a second flow electrode, e.g., the drain, of a first transistor of a second channel type. The second flow electrode, e.g., the drain, of the added transistor and a first flow electrode, e.g., the source, of the first transistor of the second conductivity type are connected to a first supply voltage. The first flow electrode, e.g., the source, of the added transistor is connected to a second internal node which is positioned between a node of a logic block and a second flow electrode, e.g., the drain, of a second transistor of the first channel type. The first flow electrode, e.g., the source, of the second transistor of the first channel type is then connected to a second supply voltage.

In another embodiment of the invention: the gate of the added transistor of the first channel type is connected to a first internal node that is also connected to a drain of a first transistor of a second channel type and the drain of a first transistor of the first channel type; the drain of the added transistor of the first channel type and the source of the first transistor of the second channel type are connected to a first supply voltage; the source of the added transistor of the first channel type is connected to a second internal node which is also connected to the source of a second transistor of the first channel type and the drain of a third transistor of the first channel type; and the source of the third transistor of the first channel type is connected to a second supply voltage.

In one embodiment of the invention, the added transistor of the first channel type creates a resistor divider with another transistor of the first channel type. This resistor divider raises the voltage of the second internal node to a voltage that is greater than second supply voltage at the beginning of the evaluation phase of the modified domino logic circuit. Consequently, the input noise rejection of modified domino logic circuit is improved as discussed in more detail below.

A specific value for the voltage on the second internal node at the beginning of the evaluation phase can be obtained by selecting the appropriate channel width and length of for the transistors making up the resistor divider. Consequently, the input noise rejection of the modified domino logic circuit can be tailored to meet the specific needs of the designer.

The modified domino logic circuits of the invention are typically used in systems where input noise levels cannot be reduced by other means. In these cases, the solution of the present invention is more area efficient than the prior art method, discussed above, of adding static buffers to the inputs of a dynamic domino logic circuit to create a static domino logic circuit. This is because, using the method and structure of the invention, only one additional device is required, the added transistor. In contrast, using prior art methods, at least four additional devices were required for each static buffer.

In addition, the method and structure of the invention is more speed efficient than the prior art method of adding static buffers. This is because, as discussed in more detail below, each buffer required by prior art methods added at least two (2) inverter delays while, using the method of the invention, only one-half (½) of an inverter delay is added.

In addition, the method and structure of the invention is economical to implement using existing methods and devices. For instance, the additional transistor required by the invention can be added, but not connected, to the layout of critical domino logic circuit cells. Then, using the method and structure of the invention, the additional transistor of the invention can be left unconnected in the system until such time as it is accurately ascertained that the noise levels of the received signals warrant the minor speed and power penalties associated with the present invention discussed in more detail below. When a need is determined, the additional transistor can be connected with a mere change in the metal layer of the chip. Consequently, using the method and structure of the invention, even the minor speed and power penalties associated with the adding a single transistor can be avoided until it is determined accurately that a need exists.

It is to be understood that both the foregoing general description and following detailed description are intended only to exemplify and explain the invention as claimed.

BRIEF DESCRIPTION OF THE DRAWINGS

The accompanying drawings, which are incorporated in and constitute a part of this specification, illustrate embodiments of the invention and, together with the description, serve to explain the advantages and principles of the invention. In the drawings, FIG. 1A schematically illustrates a generalized prior art domino logic circuit.

DETAILED DESCRIPTION

The invention will now be described in reference to the accompanying drawings. The same reference numbers may be used throughout the drawings and the following description to refer to the same or like parts.

Figure 2A:
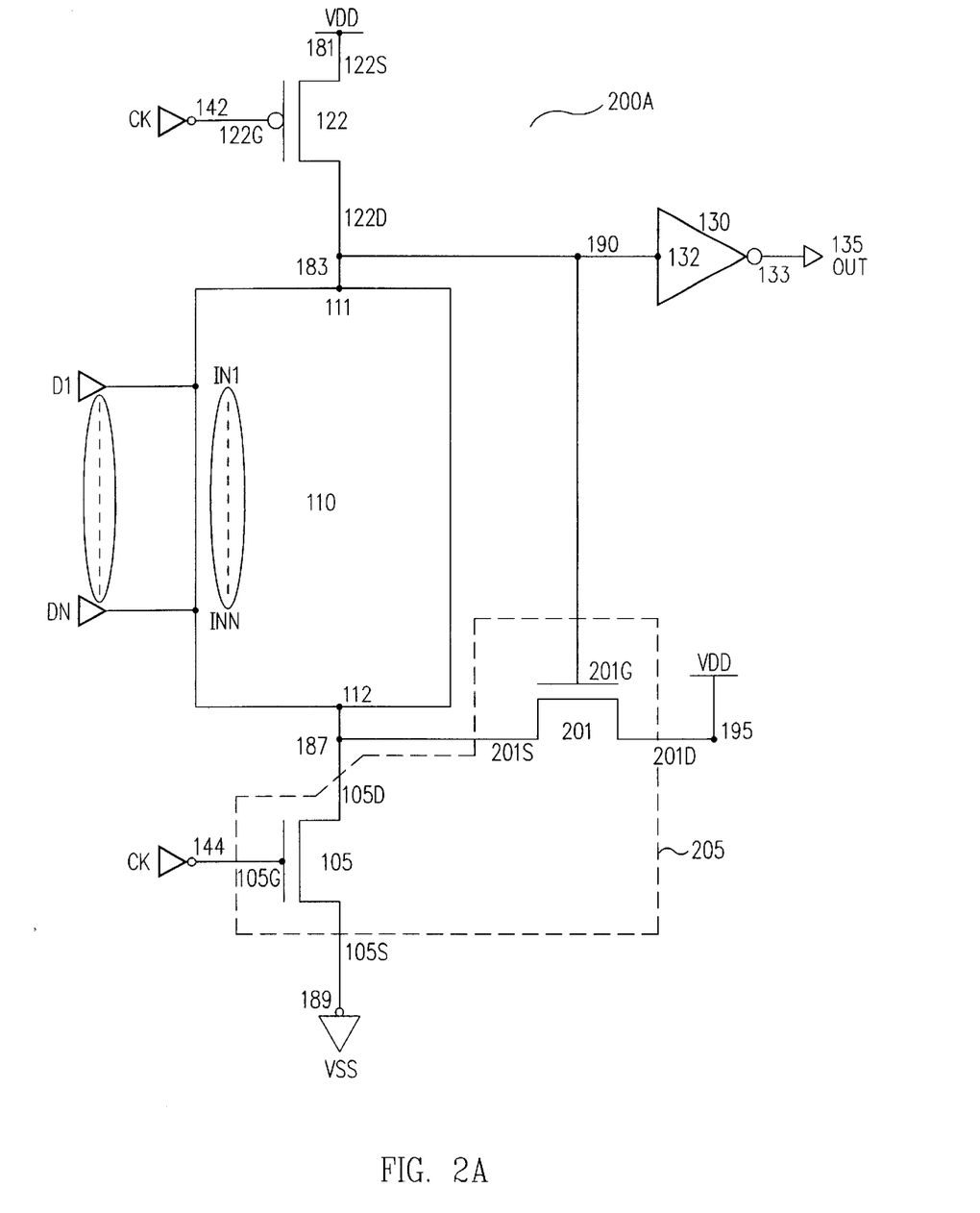
FIG. 2A schematically illustrates a generalized embodiment of a modified domino logic circuit 200A in accordance with the principles of the invention.
Figure 2B:
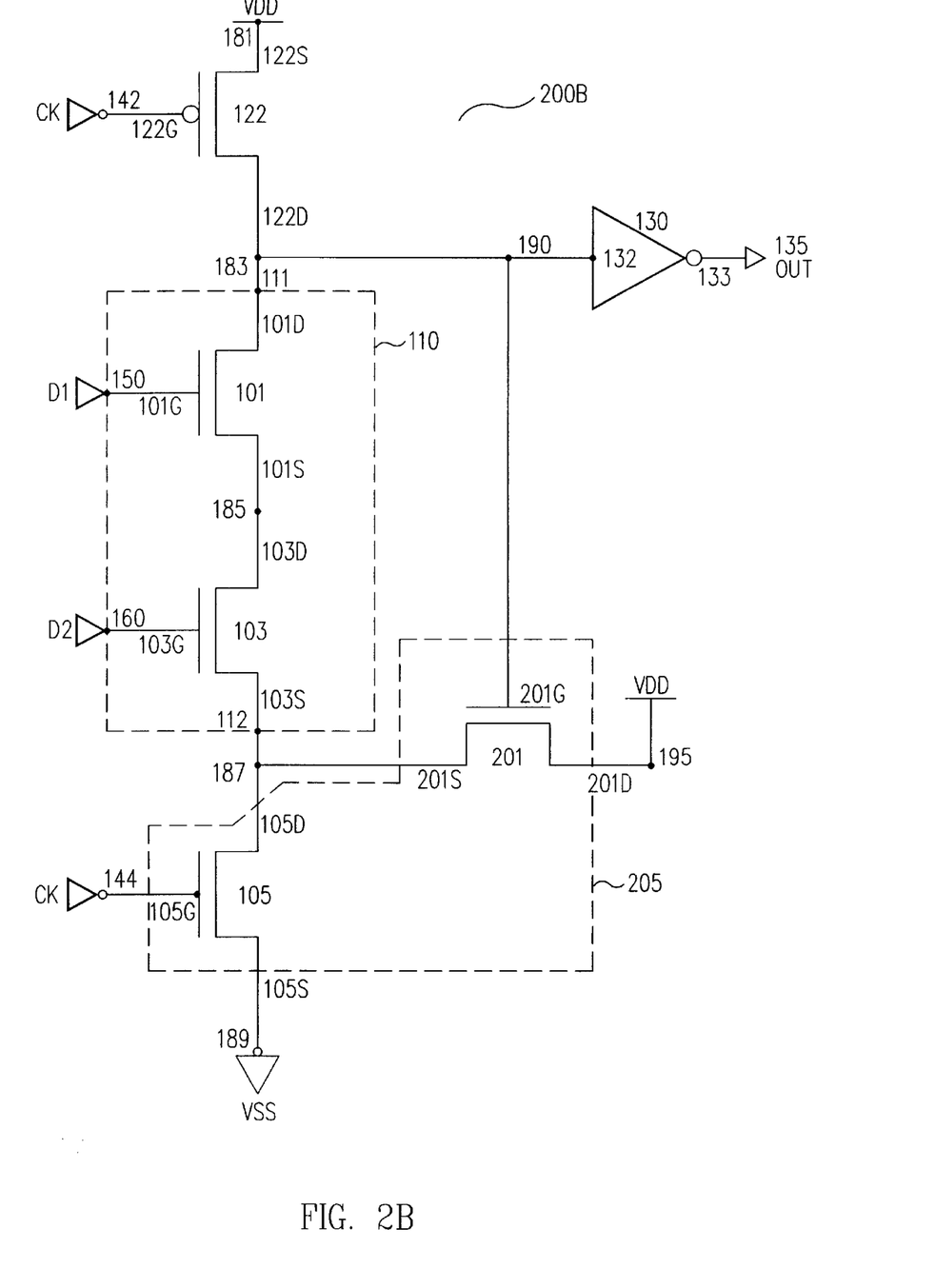
FIG. 2B schematically illustrates one embodiment of the generalized modified domino logic circuit of FIG. 2A in accordance with the principles of the invention.

In accordance with the present invention, a transistor 201 of a first channel type, in one embodiment the first channel type is "N" type (FIG. 2A and FIG. 2B), is added to prior art domino logic circuits, such as prior art domino logic circuits 100A and 100B discussed above, to create a resistor divider 205 (FIG. 1A and FIG. 1B). In one embodiment of the invention, a control electrode, e.g., gate 201G, of added transistor 201 is connected to a first internal node 190. First internal node 190 is also connected to a second flow electrode, e.g., drain 122D, of a transistor 122 of a second channel type, in one embodiment of the invention, the second channel type is a "P" type (FIG. 2A and FIG. 2B). A second flow electrode, e.g., drain 201D, of added transistor 201 is connected to a first supply voltage VDD. A first flow electrode, e.g., source 201S, of added transistor 201 is connected to a second internal node 187 which is also connected to a logic block 110 (FIG.2A), or the first flow electrode, e.g., source 103S, of a second transistor 103 of the first channel type (FIG. 2B), and the second flow electrode, e.g., drain 105D, of a third transistor 105 of the first channel type.

According to the invention, second internal node 187 is at a voltage V187 that is higher than a second supply voltage VSS at the beginning of the evaluation phase of modified domino logic circuits 200A and 200B. Consequently, first internal node 190 will not start discharging until a higher voltage is reached by input signals D1 to DN at input nodes IN1 to INN (FIG. 2A). Consequently, the input noise rejection of the modified domino logic circuit of the present invention is improved, compared to prior art domino logic circuits, by at least an amount equal to V187.

FIG. 2A shows schematically one embodiment of a generalized modified domino logic circuit 200A in accordance with one embodiment of the invention. Generalized modified domino logic circuit 200A is a modification, according to the principles of the invention, of generalized prior art domino logic circuit 100A of FIG. 1A.

As with generalized prior art domino logic circuit 100A, in generalized modified domino logic circuit 200A (FIG. 2A), source 122S of P-channel transistor 122 is connected to junction 181 and supply voltage VDD. Gate 122G of P-channel transistor 122 is connected to node 142 that receives clock signal CK. Drain 122D of P-channel transistor 122 is connected to junction 183. N-Junction 183 is connected to first internal node 190 and node 111 of logic block 110. First internal node 190 is also connected to input node 132 of inverter 130. Inverter 130 includes output node 133 that is coupled to circuit output node 135.

Logic block 110 typically comprises one of several different logic circuits and/or gates well known to those of skill in the art. For instance, in one embodiment, logic block 110 comprises AND gate logic. However, logic block 110 could also comprise a NAND gate, OR gate, NOR gate, selective OR gate or any other gate or logic circuit required for a particular application of generalized modified domino logic circuit 110. Input nodes IN1 to INN of logic block 110 are connected to receive data signals D1 to DN. The number of data signals "DN", and therefore the number in input nodes "INN" varies depending on the logic making up a particular embodiment of logic block 110 and the requirements of the system (not shown) employing prior art domino logic circuit 100A. A specific embodiment of logic block 110 is discussed in more detail below.

Logic block 110 also includes node 112 that is connected to second internal node 187. Second internal node 187 is connected to drain 105D of N-channel transistor 105. Gate 105G of N-channel transistor 105 is connected to input node 144 to receive the clock signal CK. Source 105S of N-channel transistor 105 is then connected to junction 189 and a second supply voltage, e.g., ground supply voltage VSS.

According to the method and structure of the invention, an additional NMOS device, N-channel transistor 201, is added to generalized prior art domino logic circuit 100A to form a resistor divider 205 (FIG. 1A). As shown in FIG. 2A, in one embodiment, gate 201G of N-channel transistor 201 is connected to first internal node 190, input 132 of inverter 130, and drain 122D of P-channel transistor 122. Drain 201D of N-channel transistor 201 is connected to first supply voltage, e.g., supply voltage VDD, at junction 195. Source 201S of N-channel transistor 201 is connected to second internal node 187 which is positioned between node 112 of logic block 110 and drain 105D of N-channel transistor 105.

According to the method and structure of the invention, during pre-charge, i.e., when clock signal CLK on nodes 142 and 144 is low (or a logic "0"), node 190 is pre-charged to approximately VDD and N-channel transistor 201 is turned on, i.e., current flows through N-channel transistor 201. On the other hand, during evaluation, i.e., when clock signal CLK on nodes 142 and 144 is high (or a logic "1"), and, for example data signals D1 to DN on input nodes IN1 to INN are a high, first internal node 190 is discharged and N-channel transistor 201 is turned off.

With the addition of N-channel transistor 201, according to the invention, resistor divider 205 is created which is composed of N-channel transistor 105 and N-channel transistor 201. Resistor divider 205 raises the voltage of second internal node 187 to a voltage V187 at the beginning of the evaluation phase, i.e., when clock signal CLK on nodes 142 and 144 goes high. This is because first internal node 190 is pre-charged to VDD during pre-charge, as discussed above, and drain 105D of N-channel transistor 105 is driven to voltage VDD during evaluation, i.e., when clock signal CLK on nodes 142 and 144 goes high. Therefore, both N-channel transistor 105 and N-channel transistor 201 are "ON" at the beginning of the evaluation phase, i.e., when clock signal CLK on nodes 142 and 144 goes high, and second internal node 187 is driven to a voltage V187 which is greater than ground supply voltage VSS.

The actual voltage V187 on second internal node 187 at the beginning of the evaluation phase depends on the ratio between the geometries of N-channel transistor 105 and N-channel transistor 201. Consequently, by selecting the appropriate channel width and length of for N-channel transistor 105 and N-channel transistor 201, a specific value for voltage V187 on second internal node 187 at the beginning of the evaluation phase can be obtained.

According to the invention, second internal node 187 is at a voltage V187 which is higher than ground supply voltage VSS at the beginning of the evaluation phase, i.e., when clock signal CK goes high. Consequently, first internal node 190 will not start discharging until a higher voltage is reached by input signals D1 to DN at input nodes IN1 to INN. Therefore, the input noise rejection of generalized modified domino logic circuit 200A is improved compared to generalized prior art domino logic circuit 100A by at least an amount equal to V187.

Further, as discussed above, a specific value for voltage V187 on second internal node 187 at the beginning of the evaluation phase can be obtained by selecting the appropriate channel width and length for N-channel transistor 105 and N-channel transistor 201. Consequently, the input noise rejection of modified domino logic circuit 200A can be tailored to meet the specific needs of the designer.

As discussed above, the value of voltage V187 depends on the ratio of the geometries between N-channel transistor 105 and N-channel transistor 201. In one embodiment of the invention, the geometries of N-channel transistor 105 and N-channel transistor 201 are approximately equal. In this embodiment, the noise threshold of modified domino logic circuit 200A can be nearly doubled compared with the noise threshold of generalized prior art domino logic circuit 100A. Of course, by varying the ratio of the geometries of N-channel transistor 105 and N-channel transistor 201, the noise threshold of modified domino logic circuit 200A can be improved even more. However, there is a penalty, in terms of speed and power, associated with increasing the noise threshold of modified logic circuit 200A.

The speed penalty arises because an increase in the noise threshold also means an increase in the switching threshold. This slows down modified domino logic circuit 200A during normal operation. However, this speed penalty is only a fraction of an inverter delay, about one-half (½) an inverter delay.

The power penalty is due to the fact that there exists a direct current (DC) path between first supply voltage VDD and second or ground supply voltage VSS when both N-channel transistor 105 and N-channel transistor 201 are on. This path between supply voltage VDD and ground supply voltage VSS remains on until first internal node 190 discharges or until the pre-charge phase begins, i.e., clock signal CK is driven low.

FIG. 2B schematically illustrates a modified domino logic circuit 200B in accordance with the principles of the invention. Modified domino logic circuit 200B is one of several possible embodiments of modified domino logic circuit 200A (FIG. 2A) designed according to the principles of the invention. Consequently, Modified domino logic circuit 200B is identical to modified domino logic circuit 200A but includes an AND gate embodiment of logic block 110 which comprises two data inputs, D1 and D2, and two N-channel transistors 101 and 103.

Modified domino logic circuit 200B is a modification, according to the principles of the invention, of prior art domino logic circuit 100B of FIG. 1B. Like prior art domino logic circuit 100B, modified domino logic circuit 200B (FIG.2B) typically receives two input data signals D1 and D2 at nodes 150 and 160, respectively. Modified domino logic circuit 200B, like generalized modified domino logic circuit 200A, also typically includes P-channel transistor 122 and N-channel transistor 105.

As shown in FIG. 2B, N-channel transistors 101 and 103 included in modified domino logic circuit 200B and are typically NMOS transistors having their channel regions connected in series between the drain 122D of P-channel transistor 122 at junction 183 and the drain 105D of N-channel transistor 105 at second internal node 187. More specifically, the source 122S of P-channel transistor 122 is connected to first supply voltage VDD at junction 181 and the drain 122D of P-channel transistor 122 is connected to junction 183, first internal node 190, and input node 132 of inverter 130. Inverter 130 also includes output node 133 connected to circuit output node 135.

N-channel transistor 101 typically has its drain 101D connected to junction 183 that, as discussed above, is connected to drain 122D of P-channel transistor 122, first internal node 190, and input node 132 of inverter 130. Source 101S of N-channel transistor 101 is connected to drain 103D of N-channel transistor 103 at junction 185. Source 103S of N-channel transistor 103 is connected to drain 105D of N-channel transistor 105 at second internal node 187. Source 105S of N-channel transistor 105 is connected to ground supply voltage VSS at junction 189.

As with generalized modified domino logic circuit 200A discussed above (FIG.2A), in modified domino logic circuit 200B, the gate 122G of P-channel transistor 122 and the gate 105G of N-channel transistor 105 are connected to nodes 142 and 144, respectively, to receive the clock signal CK. In addition, the gate 101G of N-channel transistor 101 is connected to node 150 to receive data signal D1 and the gate 103G of N-channel transistor 103 is connected to node 160 to receive data signal D2.

According to the method and structure of the invention, an additional NMOS device, N-channel transistor 201 (FIG. 2B), is added to prior art domino logic circuit 100B to create resistor divider 205 (FIG. 1B). As shown in FIG. 2B, in one embodiment, the gate 201G of N-channel transistor 201 is connected to first internal node 190 and input node 132 of inverter 130. The drain 201D of N-channel transistor 201 is connected to first supply voltage VDD at junction 195. The source 201S of N-channel transistor 201 is connected to second internal node 187 which is positioned between source 103S of N-channel transistor 103 and drain 105D of N-channel transistor 105.

As discussed above, according to the method and structure of the invention, during pre-charge, i.e., when clock signal CLK on nodes 142 and 144 is low, first internal node 190 is pre-charged to approximately VDD and N-channel transistor 201 is turned on, i.e., current flows through N-channel transistor 201.

On the other hand, during evaluation, i.e., when clock signal CLK on nodes 142 and 144 is high, and, for example, data signals D1 and D2 are high, first internal node 190 is discharged and N-channel transistor 201 is turned off.

As discussed above, with the addition of N-channel transistor 201, according to the invention, resistor divider 205 is created which is composed of N-channel transistor 105 and N-channel transistor 201. Resistor divider 205 raises the voltage of second internal node 187 to a voltage V187 at the beginning of the evaluation phase, i.e., when clock signal CLK on nodes 142 and 144 goes high. This is because first internal node 190 is pre-charged to VDD during pre-charge, as discussed above, and drain 105D of N-channel transistor 105 is driven to voltage VDD during evaluation, i.e., when clock signal CLK on nodes 142 and 144 goes high. Therefore, both N-channel transistor 105 and N-channel transistor 201 are "ON" at the beginning of the evaluation phase, i.e., when clock signal CLK on nodes 142 and 144 goes high, and second internal node 187 is driven to a voltage V187 which is greater than ground supply voltage VSS.

As also discussed above with respect to FIG. 2A and generalized modified domino logic circuit 200A, the actual voltage V187 on second internal node 187 at the beginning of the evaluation phase depends on the ratio between the geometries of N-channel transistor 105 and N-channel transistor 201. Consequently, by selecting the appropriate channel width and length of for N-channel transistor 105 and N-channel transistor 201, a specific value for voltage V187 on second internal node 187 at the beginning of the evaluation phase can be obtained.

According to the invention, second internal node 187 is at a voltage V187 which is higher than ground supply voltage VSS at the beginning of the evaluation phase. Consequently, input signal D2 at node 160 needs to reach a voltage equal to the threshold voltage of N-channel transistor 103 (VTH103) plus the voltage V187 (VTH103+V187) in order to turn on N-channel transistor 103. Therefore, first internal node 190 will not start discharging until this higher voltage (VTH103+V187) is reached. Consequently, the input noise rejection of modified domino logic circuit 200B is improved, compared to prior art domino logic circuit 100B, by an amount equal to V187.

Further, as discussed above, a specific value for voltage V187 on second internal node 187 at the beginning of the evaluation phase can be obtained by selecting the appropriate channel width and length for N-channel transistor 105 and N-channel transistor 201. Consequently, the input noise rejection of modified domino logic circuit 200B can be tailored to meet the specific needs of the designer.

In addition, node 187 is not at the ground supply voltage VSS. Assuming that the bulk of N-channel transistor 103 is at ground supply voltage VSS, i.e., the bulk is grounded, the threshold voltage VTH103 of N-channel transistor 103 is increased due to body effect, as is well known to those of skill in the art. This fact also increases the noise threshold of modified domino logic circuit 200B.

As discussed above, the value of voltage V187 depends on the ratio of the geometries between N-channel transistor 105 and N-channel transistor 201. In one embodiment of the invention, the geometries of N-channel transistor 105 and N-channel transistor 201 are approximately equal. In this embodiment, the noise threshold of modified domino logic circuit 200B can be nearly doubled compared with the noise threshold of prior art domino logic circuit 100B. Of course, as discussed above, by varying the ratio of the geometries of N-channel transistor 105 and N-channel transistor 201, the noise threshold of modified domino logic circuit 200B can be improved even more. However, as was the case with modified domino logic circuit 200A discussed above, there is a penalty, in terms of speed and power, associated with increasing the noise threshold of modified logic circuit 200B.

As discussed above, the speed penalty arises because a noise threshold increase also means a switching threshold increase. This slows down modified domino logic circuit 200B during normal operation. However, using the method and structure of the invention, this speed penalty is only a fraction of an inverter delay, about one-half (½) of an inverter delay.

The power penalty is due to the fact that there exists a direct current (DC) path between supply voltage VDD and ground supply voltage VSS when both N-channel transistor 105 and N-channel transistor 201 are on. This path between supply voltage VDD and ground supply voltage VSS remains on until first internal node 190 discharges or until the pre-charge phase begins, i.e., clock signal CK is driven low.

Particular types of transistors, made by particular processes and with particular first or second channel types, i.e., "P" or "N" channel types, are shown in modified domino logic circuits 200A and 200B and discussed above. However, those of skill in the art will readily recognize that other types of transistors, made by other processes and/or having opposite first and second channel types, could be employed by making minor changes to modified domino logic circuits 200A and 200B. The choice of the particular transistor types for the discussion above was made for exemplary purposes only. Therefore, this choice of transistor types should not be read as limiting the invention to the particular embodiments shown.

Because of the speed and power penalties associated with modified domino logic circuits 200A and 200B, modified domino logic circuits 200A and 200B are typically used in systems where input noise levels cannot be reduced by other means. In these cases, the solution of the present invention is more area efficient than the prior art method, discussed above, of adding static buffers to the inputs of a dynamic domino logic circuit to create a static domino logic circuit. This is because, using the method and structure of the invention, only one additional device is required, N-channel transistor 201. In contrast, using prior art methods at least four additional devices were required for each static buffer.

In addition, the method and structure of the invention is more speed efficient than the prior art method of adding static buffers. This is because, as discussed above, each buffer required by prior art methods, adds at least two (2) inverter delays while, using the method and structure of the invention, only one-half (½) of an inverter delay is added.

In addition, the method and structure of the invention is economical to implement using existing methods and devices and extremely design flexible. For instance, the additional transistor required by the invention, such as N-channel transistor 201 in FIG. 2A and FIG. 2B, can be added, but not connected, to the layout of critical domino logic circuit cells. Critical domino logic cells can be defined as those receiving signals routed from relatively long distances on the chip that are particularly susceptible to picking up noise because of the distances traveled. Using the method and structure of the invention, the additional transistor of the invention can be left unconnected in the system until such time as it is accurately ascertained that the noise levels of the received signals warrant the minor speed and power penalties discussed above. When a need is determined, the additional transistor can then be connected with a mere change in the metal layer of the chip. Consequently, using the method and structure of the invention, even the minor speed and power penalties associated with the adding a single transistor can be avoided until it is determined accurately that a need exists.

This application is related to Klass, commonly assigned U.S. Pat. No. 5,933,038, entitled "FLIP-FLOP WITH LOGIC FUNCTION INCORPORATED THEREIN WITH MINIMAL TIME PENALTY", which is herein incorporated by reference in its entirety.

The foregoing description of implementations of the invention has been presented for purposes of illustration and description, and therefore is not exhaustive and does not limit the invention to the precise form disclosed. Modifications and variations are possible in light of the above teachings or may be acquired from practicing the invention. For instance, as discussed above, particular types of transistors, made by particular processes and with particular first or second channel types, i.e., "P" or "N" channel types, are discussed above. However, those of skill in the art will readily recognize that other types of transistors, made by other processes and/or having opposite first and second channel types, could be employed, according to the principles of the invention, by making minor changes to embodiments discussed herein.

What is claimed is:

1. A modified domino logic circuit comprising:
   a first internal node coupled to an output node of said modified domino logic circuit;
   a second internal node;
   a first transistor of a first channel type, said first transistor having a first flow electrode, a second flow electrode and a control electrode, said first flow electrode of said first transistor being coupled to said second internal node of said modified domino logic circuit, said second flow electrode of said first transistor being coupled to a first supply voltage, said control electrode of said first transistor being coupled to said first internal node of said modified domino logic circuit; and
   a second transistor of said first channel type, said second transistor having a first flow electrode, a second flow electrode and a control electrode, said second flow electrode of said second transistor being coupled directly to said first flow electrode of said first transistor and to said second internal node of said modified domino logic circuit, said first flow electrode of said second transistor being coupled a second supply voltage; wherein,
   said first and second transistors of said first channel type form a resistor divider coupled between said first internal node and said second internal node of said modified domino logic circuit.

2. The modified domino logic circuit of claim 1, further comprising:
   a third transistor of a second channel type, said third transistor having a first flow electrode, a second flow electrode and a control electrode, said first flow electrode of said third transistor being coupled to said first supply voltage, said second flow electrode of said third transistor being coupled to said first internal node of said modified domino logic circuit.

3. The modified domino logic circuit of claim 2, further comprising:
   a logic block, said logic block having a first node, a second node, and at least one input node, said first node of said logic block being coupled to said first internal node of said modified domino logic circuit, said second node of said logic block being coupled to said second internal node of said modified domino logic circuit.

4. The modified domino logic circuit of claim 3, further comprising:

an inverter coupled between said first internal node of said modified domino logic circuit and said output node of said modified domino logic circuit.

5. The modified domino logic circuit of claim 1, wherein said first and second transistors of said first channel type are "N" channel type transistors and said first supply voltage is greater than said second supply voltage.

6. The modified domino logic circuit of claim 2, wherein said first and second transistors of said first channel type are "N" channel type transistors, said third transistor of said second channel type is a "P" channel type transistor and said first supply voltage is greater than said second supply voltage.

7. The modified domino logic circuit of claim 3, wherein said first and second transistors of said first channel type are "N" channel type transistors, said third transistor of said second channel type is a "P" channel type transistor and said first supply voltage is greater than said second supply voltage.

8. The modified domino logic circuit of claim 4, wherein said first and second transistors of said first channel type are "N" channel type transistors, said third transistor of said second channel type is a "P" channel type transistor and said first supply voltage is greater than said second supply voltage.

9. A modified domino logic circuit comprising:

a first transistor of a second channel type, said first transistor having a first flow electrode, a second flow electrode and a control electrode, said first flow electrode of said first transistor being coupled to a first supply voltage, said control electrode of said first transistor being coupled to receive a clock signal, said second flow electrode of said first transistor being coupled to a first internal node of said modified domino logic circuit;

a logic block, said logic block having a first node, a second node, and at least one input node, said first node of said logic block being coupled to said first internal node of said modified domino logic circuit, said at least one input node of said logic block being coupled to receive at least one data signal, said second node of said logic block being coupled to a second internal node of said modified domino logic circuit;

a second transistor of a first channel type, said second transistor having a first flow electrode, a second flow electrode and a control electrode, said second flow electrode of said second transistor being coupled to said second internal node of said modified domino logic circuit, said control electrode of said second transistor being coupled to receive said clock signal, said first flow electrode of said second transistor being coupled to a second supply voltage; and a third transistor of said first channel type, said third transistor having a first flow electrode, a second flow electrode and a control electrode, said first flow electrode of said third transistor being coupled directly to said second flow electrode of said second transistor and to said second internal node of said modified domino logic circuit, said second flow electrode of said third transistor being coupled to said first supply voltage, said control electrode of said third transistor being coupled to said first internal node of said modified domino logic circuit.

10. The modified domino logic circuit of claim 9, wherein said second and third transistors of said first channel type are "N" channel type transistors, said first transistor of said second channel type is a "P" channel type transistor and said first supply voltage is greater than said second supply voltage.

11. The modified domino logic circuit of claim 10, further comprising:

an inverter coupled between said first internal node of said modified domino logic circuit and an output node of said modified domino logic circuit.

12. A modified domino logic circuit comprising:

a first transistor of a second channel type, said first transistor having a first flow electrode, a second flow electrode and a control electrode, said first flow electrode of said first transistor being coupled to a first supply voltage, said control electrode of said first transistor being coupled to receive a clock signal, said second flow electrode of said first transistor being coupled to a first internal node of said modified domino logic circuit;

a second transistor of a first channel type, said second transistor having a first flow electrode, a second flow electrode and a control electrode, said second flow electrode of said second transistor being coupled to said second flow electrode of said first transistor, said control electrode of said second transistor being coupled to receive a first data signal;

a third transistor of said first channel type, said third transistor having a first flow electrode, a second flow electrode and a control electrode, said second flow electrode of said third transistor being coupled to said first flow electrode of said second transistor, said control electrode of said third transistor being coupled to receive a second data signal, said first flow electrode of said third transistor being coupled to a second internal node of said modified domino logic circuit;

a fourth transistor of said first channel type, said fourth transistor having a first flow electrode, a second flow electrode and a control electrode, said second flow electrode of said fourth transistor being coupled to said second internal node of said modified domino logic circuit, said control electrode of said fourth transistor being coupled to receive said clock signal, said first flow electrode of said fourth transistor being coupled to a second supply voltage; and a fifth transistor of said first channel type, said fifth transistor having a first flow electrode, a second flow electrode and a control electrode, said first flow electrode of said fifth transistor being coupled directly to said second flow electrode of said fourth transistor and to said second internal node of said modified domino logic circuit, said second flow electrode of said fifth transistor being coupled to said first supply voltage, said control electrode of said fifth transistor being coupled to said first internal node of said modified domino logic circuit.

13. The modified domino logic circuit of claim 12, wherein said second, third, fourth and fifth transistors of said first channel type are "N" channel type transistors, said first transistor of said second channel type is a "P" channel type transistor and said first supply voltage is greater than said second supply voltage.

14. The modified domino logic circuit of claim 13, further comprising:
an inverter coupled between said first internal node of said modified domino logic circuit and an output node of said modified domino logic circuit.

15. A method for increasing the noise threshold of a domino logic circuit comprising:
providing a first transistor of a first channel type, said first transistor having a first flow electrode, a second flow electrode and a control electrode;
coupling said control electrode of said first transistor to a first internal node of said domino logic circuit;
coupling said first flow electrode of said first transistor to a second internal node of said domino logic circuit;
coupling said second flow electrode of said first transistor to a first supply voltage;
providing a second transistor of said first channel type, said second transistor having a first flow electrode, a second flow electrode and a control electrode;
coupling said second flow electrode of said second transistor directly to said first flow electrode of said first transistor and to said second internal node of said domino logic circuit; and
coupling said first flow electrode of said second transistor to a second supply voltage;
whereby,
said first and second transistors of said first channel type form a resistor divider coupled between said first internal node and said second internal node of said domino logic circuit.

16. The method of claim 15, wherein said first and second transistors of said first channel type are "N" channel type transistors and said first supply voltage is greater than said second supply voltage.

17. A method for increasing the noise threshold of a domino logic circuit comprising:
providing a first transistor of a second channel type, said first transistor having a first flow electrode, a second flow electrode and a control electrode;
coupling said first flow electrode of said first transistor to a first supply voltage;
coupling said control electrode of said first transistor to receive a clock signal;
coupling said second flow electrode of said first transistor to a first internal node of said domino logic circuit;
providing a logic block, said logic block having a first node, a second node, and at least one input node;
coupling said first node of said logic block to said first internal node of said domino logic circuit;
coupling said at least one input node of said logic block to receive at least one data signal;
coupling said second node of said logic block to a second internal node of said domino logic circuit;
providing a second transistor of a first channel type, said second transistor having a first flow electrode, a second flow electrode and a control electrode;
coupling said second flow electrode of said second transistor to said second internal node of said domino logic circuit;
coupling said control electrode of said second transistor to receive said clock signal;
coupling said first flow electrode of said second transistor to a second supply voltage;
providing a third transistor of said first channel type, said third transistor having a first flow electrode, a second flow electrode and a control electrode;
coupling said first flow electrode of said third transistor directly to said second flow electrode of said second transistor and to said second internal node of said domino logic circuit;
coupling said second flow electrode of said third transistor to said first supply voltage; and
coupling said control electrode of said third transistor t said first internal node of said domino logic circuit.

18. The method of claim 17, wherein said second and third transistors of said first channel type are "N" channel type transistors, said first transistor of said second channel type is a "P" channel type transistor and said first supply voltage is greater than said second supply voltage.

19. A method for increasing the noise threshold of a domino logic circuit comprising:
providing a first transistor of a second channel type, said first transistor having a first flow electrode, a second flow electrode and a control electrode;
coupling said first flow electrode of said first transistor to a first supply voltage;
coupling said control electrode of said first transistor to receive a clock signal;
coupling said second flow electrode of said first transistor to a first internal node of said domino logic circuit;
providing a second transistor of a first channel type, said second transistor having a first flow electrode, a second flow electrode and a control electrode;
coupling said second flow electrode of said second transistor to said second flow electrode of said first transistor;
coupling said control electrode of said second transistor to receive a first data signal;
providing a third transistor of said first channel type, said third transistor having a first flow electrode, a second flow electrode and a control electrode;
coupling said second flow electrode of said third transistor to said first flow electrode of said second transistor;
coupling said control electrode of said third transistor to receive a second data signal;
coupling said first flow electrode of said third transistor to a second internal node of said domino logic circuit;
providing a fourth transistor of said first channel type, said fourth transistor having a first flow electrode, a second flow electrode and a control electrode;
coupling said second flow electrode of said fourth transistor to said second internal node of said domino logic circuit;
coupling said control electrode of said fourth transistor to receive said clock signal;
coupling said first flow electrode of said fourth transistor to a second supply voltage;
providing a fifth transistor of said first channel type, said fifth transistor having a first flow electrode, a second flow electrode and a control electrode;
coupling said first flow electrode of said fifth transistor directly to said second flow electrode of said fourth transistor and to said second internal node of said domino logic circuit;
coupling said second flow electrode of said fifth transistor to said first supply voltage; and
coupling said control electrode of said fifth transistor to said first internal node of said modified domino logic circuit.

20. The modified domino logic block of claim 19, wherein said second, third, fourth and fifth transistors of said first channel type are "N" channel type transistors, said first transistor of said second channel type is a "P" channel type transistor and said first supply voltage is greater than said second supply voltage.

* * * * *